United States Patent [19]

Headrick

[11] Patent Number: 4,668,841

[45] Date of Patent: May 26, 1987

[54] SOLAR GENERATOR MOUNTING STRUCTURE

[76] Inventor: Richard T. Headrick, 5200 Irvine Blvd., Space 24, Irvine, Calif. 92714

[21] Appl. No.: 872,202

[22] Filed: Jun. 9, 1986

Related U.S. Application Data

[63] Continuation-in-part of Ser. No. 612,797, May 22, 1984, Pat. No. 4,594,470, which is a continuation-in-part of Ser. No. 527,164, Aug. 26, 1983, abandoned.

[51] Int. Cl.$^4$ .............................................. H02N 6/00
[52] U.S. Cl. .................................................... 136/246
[58] Field of Search ......................................... 136/246

[56] References Cited

U.S. PATENT DOCUMENTS 4,594,470  6/1986  Headrick ............................ 136/246

Primary Examiner—Aaron Weisstuch
Attorney, Agent, or Firm—Jackson & Jones

[57] ABSTRACT

A solar generator in the shape of a dome segment is disclosed. The generator utilizes an inner dome-shaped support structure nested inside a slightly larger output dome-shaped space frame. The space frame is adapted for rotation at a fixed angular velocity about the inner support dome. The space frame carries a plurality of prewired identical solar cell panels mounted on flat support planes, which are positioned at three preferred angles relative to the horizon. These angles are 60°, 45°, and 30° respectively from the lowest to the highest solar cell mounting locations on the space frame. The support frame is protected from "shadowing" in both vertical and horizontal planes.

12 Claims, 3 Drawing Figures

SOLAR GENERATOR MOUNTING STRUCTURE

This application is a continuation-in-part of a pending application having Ser. No. 612,797 filed on May 22, 1984, which application will issue as U.S. Pat. No. 4,594,470 on June 10, 1986. The '797 application, in turn, which is a continuation-in-part of a now abandoned application by the same inventor having Ser. No. 527,164 filed on Aug. 26, 1983.

BACKGROUND OF THE INVENTION

1. Origin of the Invention

This invention was originated by a sole inventor in response to a perceived need for improvements in the field of solar energy generation.

2. Incorporation by reference.

Both essential and nonessential material is hereby incorporated by reference to said U.S. Pat. No. 4,594,470. Particularly, I hereby incorporate from the soon to issue '470 patent: FIGS. 1 and 2 and the description thereof to explain the sun's movement; FIG. 3 and the description thereof to explain an inner dome support and an outer space frame support; FIG. 4 and the description thereof to explain symmetry of photovoltaic ("PV") arrays on both sides of a centrally located centerline; FIGS. 5, 7, 7A, 7B, 7C, 10, 10A, 11 and the description thereof for a definition of means for rotating a space frame in a single axis, and FIG. 8 and the description thereof for a double axis rotation; and FIGS. 5, 6 and the description thereof to define a clearance circle between the underside of the space frame and the exterior surface of the inner dome-shaped support.

3. Field of the Invention

This invention relates to an improved mounting and support structure for housing state-of-the-art solar, or photovoltaic ("PV"), panels. In particular it relates to a segment of a dome structure (the "space frame") rotatably mounted on a complete underlying dome structure. Flat PV panels in preassembled and wired standard sizes (of which the entire array system is assembled) are mounted on the outer surface of the space frame. These panels are upwardly facing at a multiple of angles which, for the purpose of my preferred embodiment, includes three angles relative to the horizon. The system operates at any reasonable latitude with high efficiency.

BACKGROUND DISCUSSION

Harnessing the sun's rays by using PV cells to generate electricity is, today, a well known and well understood technology. A summary of several known photovoltaic energy farms is described in my '470 patent and thus needs no detailed description herein. As there described, "double axis" tracking arrays which can follow the sun's actual position, regardless of time, date or season, is possible only with an elaborate and expensive computer-controlled system. Picking a spot on the earth, a viewer looking at the sun's movement will note that it is not moving at a fixed angular velocity. Assuming that an array is precisely pointed at the sun at noon and will rotate at a constant velocity around its base dome, to track the sun's movement, the array will always be pointed directly at the sun at noon. At off-noon positions, morning and afternoon, apparent known angular differences occur wherein the array is not directly following the sun's movement. The angular difference is always less than ±15°. The angular difference, leading or lagging, relative to a precise noon alignment is referred to in this application as a "misalignment". The misalignment, in the absence of my invention, would create vertical shadows. The invention includes a misalignment or vertical "shadow" protecting feature.

In my '470 patent I have described and claimed a feature to eliminate horizontal shadowing caused by the steps in the PV arrays when the sun was higher than 30° above the horizon. With my horizontal shadow elimination, I taught that it was necessary to limit the circuitry associated with the PV arrays to about 1-foot by 4-foot PV modules positioned horizontally across the width of a course. That feature minimized the area of PV surface that would be knocked out from solar generation by a horizontal shadow line caused by the sun being slightly below the 30° angle above the horizon. The PV panels in the '470 patent were assembled from several $1' \times 4'$ standard modules in accordance with the particular panel sizes described therein. The varying panel sizes required that most of the series/parallel panel circuitry could not be incorporated into the panels themselves since they varied in size and capacity.

The unique "low silhouette" configuration, in the system herein described and claimed, further lowers the sun angle at which a shadow would occur on any portion of the array from 30° above the horizon to 20° above the horizon. Below the 20° position no vertical shadow protection is deemed necessary because the sun at that position radiates very little power. Uniform prewired panels may now be manufactured with the series/parallel circuitry incorporated therein, and will result in mass production of identical panels. Thus cost is sharply reduced and the space frame design for this invention is highly simplified.

In my '470 patent, FIGS. 12 and 13 address what would happen if no shadow producing steps remained and if standard uniform panels were used. Each $9' \times 16'$ panel consisted of 36 $1' \times 4'$ PV modules mounted in a supporting frame. While either of the configurations of FIGS. 12 or 13 were theoretically highly efficient in electrical production, they presented some structural disadvantages as compared with my new invention. For example the "bays" as defined in '470 had to be 16' wide. This width, especially towards the sides of the dome space frame, required more and higher structure to support the other edges of the panels, which in turn caused the total array assembly to be more vulnerable to wind loading.

My new invention uses $8' \times 8'$ panels which nest to the dome on a lower structural silhouette. By modifying and minimizing the steps of the array of my '470 patent in accordance with this invention, the shadow-eliminating and high energy production advantages of the ramp concept were retained, and the structural requirements were vastly simplified.

My solar voltaic structure of the '470 patent was optimized at a specific north or south latitude location. It did, however, require different design considerations to achieve maximum efficiency at different latitude locations. In this application, my invention achieves high generation efficiencies with a single design criterion that is optimized for a wide range of latitudes. Thus, for example, the same design of this invention is employed as far north as Froson, Norway or as far south as Santiago, Chile. My computer studies show that the electrical output at Froson, Norway is 73% of that at Miami, Floria using the same array in each instance.

SUMMARY OF THE INVENTION

A solar generator of my invention utilizes an inner dome-shaped support structure and a slightly larger outer dome-shaped space frame adapted for rotation at a fixed angular velocity about the inner support dome on a plurality of rails. The space frame carries a plurality of pre-wired identical array panels mounted on flat support planes positioned at three preferred angles relative to the horizon. In my preferred embodiment, these plane angles are 60°, 45°, and 30°, respectively, from the lowest to the highest array locations.

My support frame is protected from "shadowing" in both vertical and horizontal planes. The total array assembly is designed with a low silhouette which "nests" to the supporting dome shape to minimize both structure and wind vulnerability while accommodating common PV array panel sizes and yielding a high percentage of solar area for improved packing density. Thus in my preferred embodiment I achieve an array area efficiency of essentially 44% of an acre. The productive array area equals 61% of the supporting dome foot print. In terms of packing density, compared with present double-axis Hesperia test fields which yield 60 kw (peak) per acre, the packing density of my preferred embodiment is increased to 211 kw (peak) per acre, an increase of over 350% relative to the prior art.

DETAILED DESCRIPTION OF THE DRAWINGS

Figure 1:
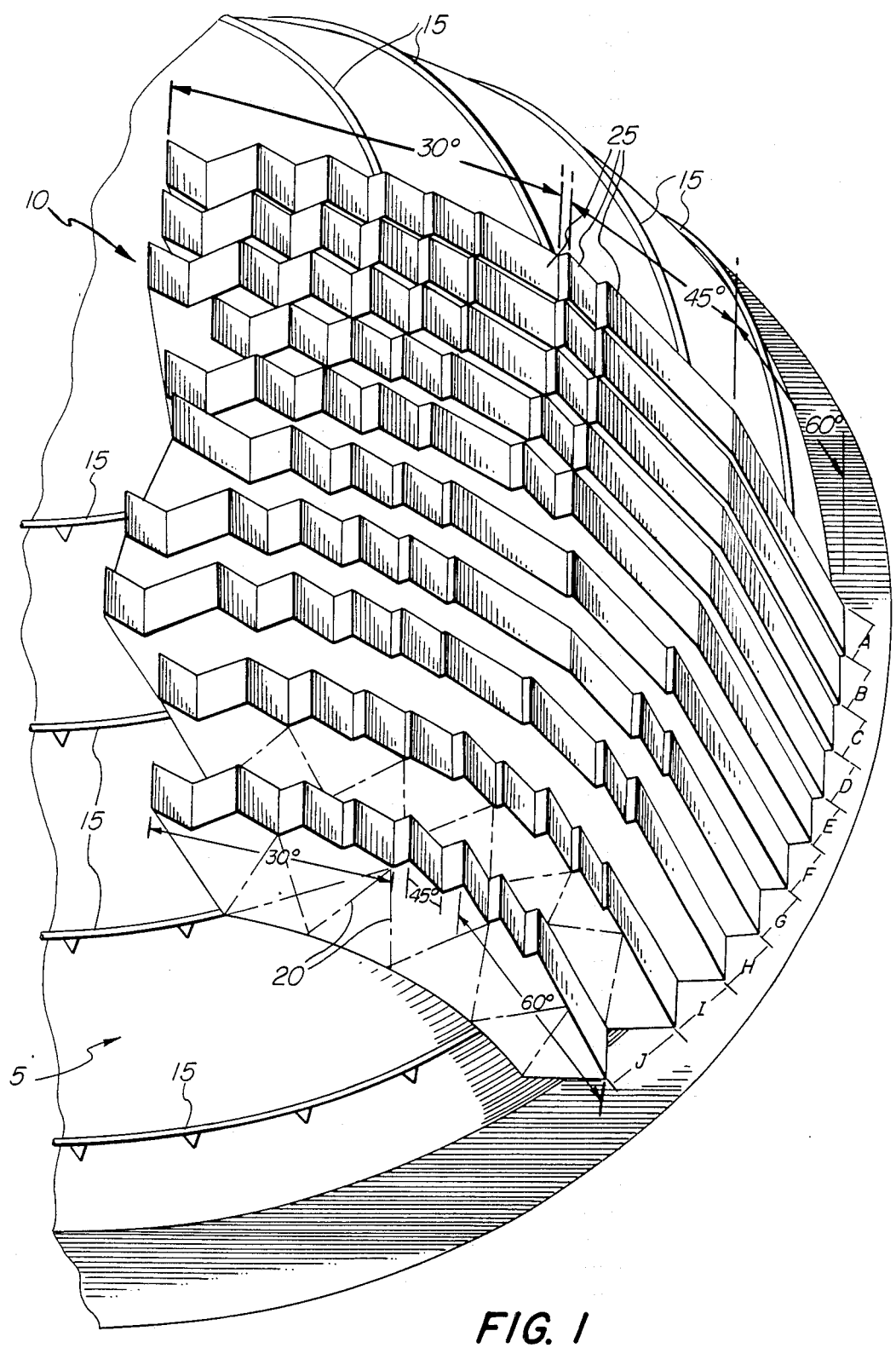
FIG. 1, is a scaled perspective foreground view of a solar voltaic generator in accordance with my invention.

My invention, with reference to FIG. 1, provides a segment 10 of a dome shaped structure rotatably mounted on an underlying dome structure 5. The segment is the near half of the total array structure and is the same half shown in FIG. 2 in front view. Inner dome 5 may be an essentially closed structure oro an open framework approximating the same structural contour. Segment 10 rotates on rails 15 circumscribing the inner dome 5 at several levels. Each rail 15 is concentric to the other with the plane of each rail being precisely parallel to that of the next adjacent (above and/or below) rail. Wheel sets are affixed to the rotating segment 10 and are locked to the rings 15 by additional wheels underneath to prevent wind uplift as is shown and described in FIGS. 10, 10A and 11 of my '470 patent. A propelling means, with a monitoring and automatic correcting system to ensure accuracy, is provided to move the structure around the dome once in precisely 24 hours. This propelling means constitutes the basics of my "single axis tracker" as is fully described in my '470 patent.

It would require a great amount of complexity in the electrical and mechanical design of the propelling system in order to precisely track the sun, free of vertical shadowing. Even though such precise and costly tracking technology is available, I have elected to allow the rotation of the single, axis tracking system to be at a constant angular velocity. I offset adjacent bays of the array 10 by ±15° angles to avoid vertical shadows caused by such constant rotation and the suns's apparent misalignment.

Figure 2:
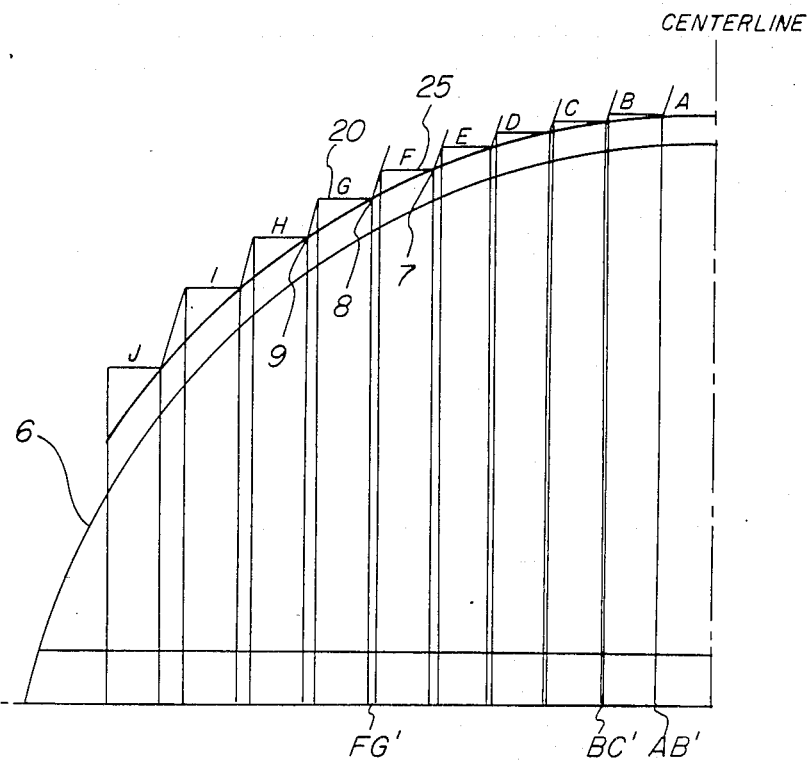
FIG. 2, is one half of a front elevation taken along the planes of the bays of the solar voltaic generator of FIG. 1.

The open frame construction of segment 10 consists of a relatively light framework 20 as shown symbolically in FIG. 2. In this view (which represents a typical solar voltaic generating structure) the center "backbone" of the space frame is shown on the extreme right side, and is identified as a "centerline". The solar array is made up of multiples of 8'×8' prewired assemblies of approximately 16 each 1'×4' ARCO-Solar (or equivalent) "PV" modules 25. The parallel bays, housing the modules 25, are shown in FIG. 2 as vertical columns. Each bay is approximately an 8' wide strip which is identified with alphabetic letters, A, B, C, etc.

As the positions of the bays progress radially downward and counterclockwise along the curve of the left half of the dome, the 8' bays are separated from each other by a vertical margin designated as AB', BC', CD', DE' etc. Each of these margins has a width and depth that is determined by a 15° angle starting at the termination of the left edge of the adjacent array assembly and extending downward, to the left, to intersect with the clearance circle 6. From each intersection point, such as points 7, 8, 9 for example, the horizontal line to the left represents the flat plane of the next bay, which plane may house a strip of PV modules. Those modules are shown shaded in FIG. 1. The purpose of the 15° angle is to accommodate what I call "angular misalignment shadows". Such shadows occur because the sun's apparent movement does not traverse through the azimuth at a constant rate measured angularly with relation to the fixed angular rotation of my single axis tracking system.

At noon the system is precisely centered on the sun. A constant angular velocity movement of the system is supplied by any suitable-controlled rotation means. The sun's apparent velocity changes between sunup and until sundown. The apparent change causes the system to lead or lag the precise noon—alignment position at off-noon positions. The angular amount of maximum lead or lag is less than plus or minus 15°. Therefore, the 15° margin I have allowed effectively prevents any vertical "shadowing" on the surface of the array assemblies in bays A, B, C, etc.

Figure 3:
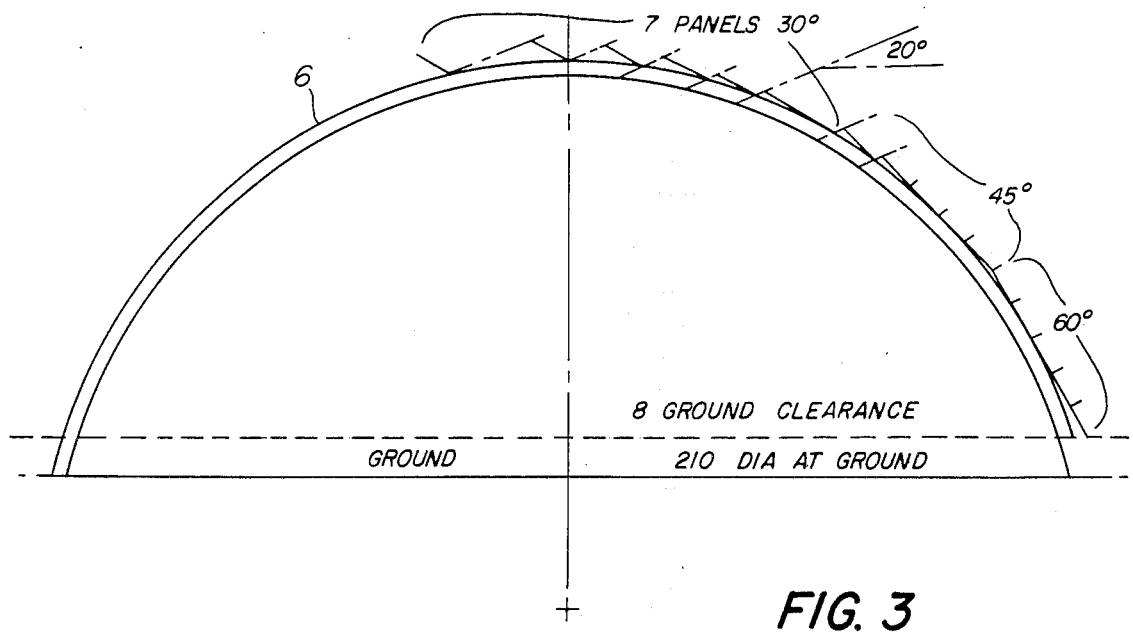
FIG. 3, is a view similar to FIGS. 12 and 13 of my '470 patent showing the three angles of my preferred embodiment as flat planes at the centerline of the space frame.

As shown in FIG. 3, the planes of multiple 8'×8' array assemblies at the centerline are in the form of the three array angles relative to the horizon (30°, 45°, and 60°). I consider the selection of angles of the flat planes of the array system to be an important feature of this invention. After research pertaining to sun angles and elevation at widely separated latitudes, and motivated by my determination to not re-design the system for every few degrees of latitude change, I settled upon the three compromise angles shown in FIG. 3, which angles are about 30°, 45°, and 60°.

It is known that PV cells have their highest efficiency when they point directly at the sun, and that the efficiency decays rapidly to about 15° when the cell is responding only to ambient light. I have discovered that my three angles of my preferred embodiment, in a fixed angle array revolving around a single axis, takes maximum advantage of the plus-or-minus 15° spread of efficiency of the photovoltaic cells.

The angles referred to are structural acute angles measured from the horizon. The "sun angles" are the acute angles to the sun above the horizon. For the sun angle to be common to or at right angles to the array angle, its angle is complementary to the constructed upward facing array angle. Thus, for example, with a 60° upward facing array angle, the sun angle is common at 30°. Conversely, with a 30° constructed upward facing array angle, the sun angle is common at 60°. Of course, with an array angle of 45°, the sun angle is exactly the same.

The large 60° angle area, as shown in FIG. 3, goes well beyond the tangent point of that 60° plane with the clearance circle 6, and extends, for example, to the downward limit of the space frame structure which may terminate at the height of a stem wall above the ground. (Also see FIG. 1 of my '470 patent, for example). The 60° array area involves about ⅓ of the total array area of my standard solar voltaic system. This 60° portion is primarily effective in producing electrical power from a sun angle of 20° above the horizon to 50° about the horizon. However, it will also supply less effective energy from zero degrees (at the horizon) through about a 70° sun elevation angle. The uppermost 30° portion of my system includes about 43% of the total array area. This 30° portion of the array, in sunbelt latitudes, provides very high energy output from about 9:00 AM until about 3:00 PM and is particularly effective in the May to September months. The stated time and month span is recognized as a period of high energy demand for air conditioning.

I have determined that both the 60° array portion and the 30° portion would lose efficiency if they intersected. Thus I provide a 45° angle portion in my invention to compensate for this potential loss in both angles. The 45° portion allows a smooth transition of high level solar generation as the sun angle moves from the horizon to its zenith. I have allocated about 23% of the total area to the 45° angle.

If only 60° and 30° for two angles, were selected, the performance of both would be very marginal in the time periods of the day or sun angles due to latitude location in which the sun angle above the horizon was approximately 45°. This would mean that all 60° and 30° arrays would be functioning on essentially "ambient" or "background" light since the sun angles to the arrays would be beyond the 15° energy-effective limit as discussed earlier. The intermediate 45° angle bridges this gap and compensates for the energy decay between the 30° and 60° angles. My computer studies have provided verification for my selections.

Moreover, the 60° array groupings are strongly contributive to energy generation during morning sun-light and in extreme northern and southern latitudes. The 30° array areas are strongly efficient for midday sun energy production are are particularly significant in semi-equatorial areas. Array angles much steeper than about 60° would quickly become inefficient at sun angles above 45° or in the semi-equatorial zones. Array angles much flatter than about 30° would allow too great a gap with the tolerance limits of the photovoltaic cells and would only provide energy benefits in the "sun belt" areas. The three compromise angles of my invention, when relieved for horizontal and vertical shadowing, provide a highly efficient solar voltaic generator.

In order to establish (by computer study) the projected performance of my invention at various latitudes and with varying power demands, I have selected arbitrarily an inner dome diameter of 210 ft. at the ground with an eight foot stem wall clearance to lowest point of the space frame, at which point the dome diameter is 206 feet. The dome height from the ground is 83 feet, which is 75 feet above the ground clearance level. These dimensions are shown in FIG. 3. Based on this intermediate scale building which would be suitable for many purposes, I use the same design, scaled down to one-half size with arrays of four by four feet and a 105 ft. diameter dome, 41.5 feet high. I also scaled upward to a 510 ft. diameter dome using exactly the same array design only made up of combinations of pre-wired 8'×8' assemblies into 16'×16' panels. A table summarizing my computer study results is set forth as Table I. Whereas Table I uses Miami as a location, the exact same generator is studied for Frosson, Norway. Table II reflects comparable data at Frosson, Norway.

TABLE I

PERFORMANCE PROJECTIONS FOR 510, 210 AND 105 FT. DIA. SOLAR-VOLTAIC DOMES AT MIAMI LATITUDE.

| ARRAY ANGLE | PRE-WIRED ASSEMBLY | MODULES/ ASSEM. | TOTAL MODULES | ARRAY SQ. FT. | KWH/YR ANNUAL OUTPUT | KWH/YR/ACRE ANN. OUTPUT PER ACRE |
|---|---|---|---|---|---|---|
| | | | BLDG. DIA. 510 FEET | | | |
| 30° | 8' × 8' | 16 | 12,320 | 49,280 | 1,203,203 | |
| 45° | " | " | 6,560 | 26,240 | 664,376 | |
| 60° | " | " | 9,440 | 37,760 | 937,417 | |
| | TOTAL | | 28,320 | 113,280 | 2,804,996 | 598,080 |
| | | | BLDG. DIA. 210 FEET | | | |
| 30° | 8' × 8' | " | 2,080 | 8,320 | 203,138 | |
| 45° | " | " | 1,120 | 4,480 | 113,430 | |
| 60° | " | " | 1,600 | 6,400 | 158,884 | |
| | TOTAL | | 4,800 | 19,200 | 475,452 | 599,070 |
| | | | BLDG. DIA. 105 FEET | | | |
| 30° | 4' × 4' | " | 520 | 2,080 | 50,785 | |
| 45° | " | " | 280 | 1,120 | 28,358 | |
| 60° | " | " | 400 | 1,600 | 39,721 | |
| | TOTAL | | 1,200 | 4,800 | 118,864 | 597,886 |

| | | ADDITIONAL USEFUL INFORMATION: | | |
|---|---|---|---|---|
| DOME DIA. | ACRES IN FOOTPRINT | KW/PEAK | "PACKING DENSITY" KWP/ACRE | % ABOVE STATE-OF-ART 60 KW/P PER ACRE |
| 510' | 4.6 | 1,246 | 271 | 452% |
| 210' | .8 | 211.2 | 264 | 440% |
| 105' | .2 | 58 | 264 | 440% |

VALUE ELECTRICITY IF

TABLE I-continued
PERFORMANCE PROJECTIONS FOR 510, 210 AND 105 FT. DIA. SOLAR-VOLTAIC DOMES AT MIAMI LATITUDE.

| DOME DIA. | APPROX. HORSEPOWER | HORSEPOWER HOURS/YEAR | $0.10/KW HOUR/YEAR |
|---|---|---|---|
| 510' | 1,250 | 2,805,000 | $280,500.00 |
| 210' | 212 | 475,500 | 47,545.20 |
| 105' | 60 | 120,000 | 11,886.40 |

TABLE II
PERFORMANCE PROJECTIONS FOR 510, 210 AND 105 FT. DIA. SOLAR-VOLTAIC DOMES AT NORWAY LATITUDE. TOTAL OUTPUT IN NORWAY IS 73% THAT OF MIAMI WITH IDENTICAL ARRAY CONFIGURATION.

| ARRAY ANGLE | PRE-WIRED ASSEMBLY | MODULES/ ASSEM. | TOTAL MODULES | ARRAY SQ. FT. | KWH/YR ANNUAL OUTPUT | KWH/YR/ACRE ANN. OUTPUT PER ACRE |
|---|---|---|---|---|---|---|
| | | | BLDG. DIA. 510 FEET | | | |
| 30° | 8' × 8' | 16 | 12,320 | 49,280 | 804,798 | |
| 45° | " | " | 6,560 | 26,240 | 488,490 | |
| 60° | " | " | 9,440 | 37,760 | 753,362 | |
| | TOTAL | | 28,320 | 113,280 | 2,046,651 | 444,924 |

TABLE I
PERFORMANCE PROJECTIONS FOR 510, 210 AND 105 FT. DIA. SOLAR-VOLTAIC DOMES AT MIAMI LATITUDE.

| ARRAY ANGLE | PRE-WIRED ASSEMBLY | MODULES/ ASSEM. | TOTAL MODULES | ARRAY SQ. FT. | KWH/YR ANNUAL OUTPUT | KWH/YR/ACRE ANN. OUTPUT PER ACRE |
|---|---|---|---|---|---|---|
| | | | BLDG. DIA. 210 FEET | | | |
| 30° | 8' × 8' | 16 | 2,080 | 8,320 | 135,875 | |
| 45° | " | " | 1,120 | 4,480 | 83,400 | |
| 60° | " | " | 1,600 | 6,400 | 127,688 | |
| | TOTAL | | 4,800 | 19,200 | 346,963 | 433,703 |
| | | | BLDG. DIA. 105 FEET | | | |
| 30° | 4' × 4' | 4 | 520 | 2,080 | 33,969 | |
| 45° | " | " | 280 | 1,120 | 20,850 | |
| 60° | " | " | 400 | 1,600 | 31,922 | |
| | TOTAL | | 1,200 | 4,800 | 86,741 | 433,705 |

ADDITIONAL USEFUL INFORMATION:

| DOME DIA. | ACRES IN FOOTPRINT | KW/PEAK | "PACKING DENSITY" KWP/ACRE | % ABOVE STATE-OF-ART 60 KW/P PER ACRE |
|---|---|---|---|---|
| 510' | 4.6 | 1,246 | 271 | 452% |
| 210' | .8 | 211.2 | 264 | 440% |
| 105' | .2 | 58 | 264 | 440% |

| DOME IF DIA. | APPROX. HORSEPOWER | HORSEPOWER HOURS/YEAR | VALUE ELECTRICITY $0.10/KW HOUR/YEAR |
|---|---|---|---|
| 510' | 1,250 | 2,050,000 | $205,000.00 |
| 210' | 212 | 350,000 | 35,000.00 |
| 105' | 60 | 90,000 | 9,000.00 |

Also, I have determined that, depending on the electrical demand of a specific system, the total number of array square foot areas may be reduced from, or expanded beyond, what I call the "standard" system. The smallest "standard" system is increased by about 7% at the "expanded system" and by an additional 9% to reach the "maximum system" level. The expanded system terminates at bay "J". The standard system terminates at bay "G". The largest configuration will require what I call "structural outriggers" to carry the "K" bay of arrays. However, the expanded system also adds additional arays behind all of the A through G bays, up, over the top of the dome in the same manner, as taught in my '470 patent.

The problem of horizontal shadowing has to do with an unbalanced electrical situation in a large pre-wired panel in which each 1'×4' module is combined with perhaps fifteen others in a combinational pattern of series and parallel circuitry. To function effectively, all modules must be doing their part in the overall electrical system. Shadowing interferes with this. The area between productive array panels is stepped back down to the supportive structure. If that step were 45° to the horizon and if the sun is at a lower angle in the morning hours, the edge of the forward array toward the sun will cast a very sharp shadow on the array panel behind it. Depending on its particular part in the total circuitry, this shadow will allow the panel to be unbalanced. That imbalance may cause overheating of the shadowed portion even to the extent of burning out diodes, which may be thought of as small electrical "check valves" in the circuitry. If the step angle is shallower, the sun will overcome the potential shadowing effect earlier.

My invention uses a step angle in the vertical direction of 20° which has proven to be safe from the standpoint of its limited power output. FIG. 1 depicts that not all my array panels are followed by a step. In my expanded system, 73 of the 8'×8' panels are not followed by a step at all or terminate the zone as the last array so that no shadow falls behind it. Seventy-one arrays are followed by a step. I previously described the 15° misalignment or vertical shadow protection applicable to the front view of the dome. Therefore, the voltaic generator of this invention is not adversely affected by horizontal or vertical shadowing.

A computer program was used to determine if the goal of my invention was achievable. Two locations were selected, namely Miami Beach, Fla., U.S.A. and Frosson, Norway. The computer study proved that even as far north as Frosson, that the array system and circuitry on my dome was 73% as productive as the same design located at Miami Beach. Accordingly the same system scaled up or down as previously explained, may be used at most reasonable latitude locations in the world, with no change in design or function, except to be constructed smaller or larger in scale.

The inner dome may take the form of an essentially closed structure such as concrete or geodesic aluminum. If geodesic, each plane of triangles, in the areas where the rail rings will be located, must be concentric and parallel to every other plane. Also, the massive aluminum extrusions which constitute the internal frame, may be computer engineered to withstand predictable high assymetrical loadings of the relatively heavy space frame laden with 4,480, 6,400 or 7,040 square feet of array loading only one side of the dome as it moves around. Wind loadings must also be accounted for. These aluminum inner dome supports may be built to extremely large sizes. Construction is quick, precise and the inside of this dome may be insulated as heavily as is required. The aluminum exterior reflects light and heat. However, the space frame supporting the array assemblies shadows approximately 85% of the dome surface, acting as a second "desert roof", which is commonly known for use in hot climates.

All array systems will be totally interchangeable, so the stocking of spares is simple. The array modules are prewired with weatherproof cabling and screw connections. The cable harness they are plugged into is a permanent part of the space frame assembly and terminates in a high voltage commutator system, weather protected, at the very top center of the inner dome. This commutator transfers current from the rotating platform to the rigid dome and to ground facilities which may be inside the dome or preferably in a separate, small building.

The above description presents the best mode contemplated in carrying out my invention. My invention is, however, susceptible to modifications and alternate constructions from the embodiments shown in the drawings and described above. Consequently, it is not the intention to limit the invention to the particular embodiments disclosed. On the contrary, the invention is intended and shall cover all modifications, sizes and alternate constructions falling within the spirit and scope of the invention, as expressed in the appended claims when read in light of the description and drawings.

What is claimed is:

1. A dome shaped solar generator structure having flat solar cells generally facing upwardly toward the sun and extending radially upwardly and also radially around an inner dome, with said structure rotatable about the inner dome axis to follow the sun's movements, said shape and rotational velocity of said structure contributing to the possibility of horizontal and vertical shadowing on said solar cells, said generator structure comprising:
   a plurality of flat upwardly faced surfaces fixed at a plurality of predetermined angular amounts, with each angular amount selected to capture the sun's energy at different daily sun periods; and
   means offsetting the solar cell mounting locations on said surfaces in two directions to minimize horizontal and vertical shadowing between adjacent cell mounting locations.

2. A solar generator in accordance with claim 1 and further comprising:
   means for rotating said dome-shaped support structure at a constant angular velocity to essentially follow the sun's movement.

3. A solar generator in accordance with claim 1 and further comprising:
   means for ramping at least some radially upward and adjacent solar cell mounting locations in at least one of said surfaces at one of said predetermined angular amounts.

4. A solar generator in accordance with claim 1 and wherein said predetermined angular amounts further comprise:
   a first angular amount near said base of said dome selected at about sixty degrees relative to the horizon.

5. A solar generator in accordance with claim 4 and further wherein:
   a second angular amount is radially located above said first amount and is at an angle of about forty-five degrees relative to the horizon.

6. A solar generator in accordance with claim 5 and further wherein:
   a third angular amount is radially located above said second angular amount and is at an angle of about thirty degrees relative to the horizon.

7. A solar generator in accordance with claim 1 and wherein said plurality of predetermined angular amounts are further characterized in that:
   said angular amounts vary radially upwardly from about the base of the dome towards the apex thereof and comprise angular amounts varying from each other by a fixed amount of degrees.

8. A solar generator in accordance with claim 7 and further wherein:
   said angular amount of variation is about fifteen degrees and said plurality comprise three angular amounts of about sixty, forty-five, and thirty degrees measured respectively from the base location toward said apex location.

9. A solar generator in accordance with claim 1 and further comprising:
   flat solar panels having a standardized size and prewired with voltage generator circuitry; and
   said surfaces having dimensions adapted to receive integral numbers of said standardized solar cell panels.

10. A method of capturing solar energy from the sun, said method comprising the steps of:
    erecting an inner dome-shaped structure as a base around which an outer; dome-shaped segment shall rotate;
    facing a plurality of upwardly-directed solar cells on surfaces fixed at a plurality of predetermined angular amounts on said outer segment, with each angular amount selected to capture the sun's energy at different daily sun periods; and offsetting the solar cell locations on said surfaces in two directions to minimize horizontal and vertical shadowing between adjacent cell mounting locations.

11. A method in accordance with claim 10 and further comprising the step of:

rotating said outer dome-shaped segment support structure at a constant angular velocity to essentially follow the sun's movement.

12. A method in accordance with claim 10 and further comprising the step of:

ramping at least some radially upward and adjacent solar cell mounting locations in at least one of said surfaces at one of said predetermined angular amounts.

* * * * *

UNITED STATES PATENT AND TRADEMARK OFFICE
CERTIFICATE OF CORRECTION

PATENT NO. : 4,668,841
DATED : May 26, 1987
INVENTOR(S) : Richard T. Headrick

It is certified that error appears in the above—identified patent and that said Letters Patent is hereby corrected as shown below:

Column 3, Line 48, delete "oro" and insert --or--.

Column 4, Line 39, delete "suitable-controlled" and insert --suitably-controlled--.

Column 5, Line 20, delete "about" and insert --above--.

Column 6, last line, delete "VALUE ELECTRICITY IF".

Column 8, Line 5, above "0.10/KW HOUR/YEAR" insert --VALUE ELECTRICITY IF--.

Signed and Sealed this

Third Day of November, 1987

Attest:

DONALD J. QUIGG

Attesting Officer

Commissioner of Patents and Trademarks